US011152679B2

United States Patent
Wu et al.

(10) Patent No.: US 11,152,679 B2
(45) Date of Patent: Oct. 19, 2021

(54) POWER PASSING DIRECTIONAL COUPLER HAVING A SPLIT FERRITE ELEMENT

(71) Applicant: ANTRONIX INC., Cranbury, NJ (US)

(72) Inventors: Jinquan Wu, New Brunswick, NJ (US); Neil Tang, Princeton, NJ (US)

(73) Assignee: ANTRONIX INC., Cranbury, NJ (US)

(*) Notice: Subject to any disclaimer, the term of this patent is extended or adjusted under 35 U.S.C. 154(b) by 0 days.

(21) Appl. No.: 16/646,083

(22) PCT Filed: Sep. 11, 2018

(86) PCT No.: PCT/US2018/050351
§ 371 (c)(1),
(2) Date: Mar. 10, 2020

(87) PCT Pub. No.: WO2019/051448
PCT Pub. Date: Mar. 14, 2019

(65) Prior Publication Data
US 2020/0287265 A1    Sep. 10, 2020

Related U.S. Application Data

(60) Provisional application No. 62/556,695, filed on Sep. 11, 2017.

(51) Int. Cl.
*H01P 5/18* (2006.01)
(52) U.S. Cl.
CPC ..................................... *H01P 5/18* (2013.01)
(58) Field of Classification Search
CPC .................................. H01P 5/18; H01P 5/183
(Continued)

(56) References Cited

U.S. PATENT DOCUMENTS

| 5,058,198 | A | | 10/1991 | Rocci | |
| 6,066,994 | A | * | 5/2000 | Shepherd | .................. H01P 5/18 333/109 |

(Continued)

FOREIGN PATENT DOCUMENTS

| EP | 2424120 A1 | 2/2012 |
| JP | 2006005601 A | 1/2006 |
| WO | 2010065113 A1 | 6/2010 |

OTHER PUBLICATIONS

Written Opinion issued in corresponding International Patent Application No. PCT/US2018/050351 dated Nov. 11, 2018, consisting of 5 pp.

(Continued)

*Primary Examiner* — Dean O Takaoka
(74) *Attorney, Agent, or Firm* — Volpe Koenig

(57) ABSTRACT

A directional coupler includes an input connector, an output connector, and at least one tap connector. The directional coupler also includes a primary line connecting the input connector to the output connector and configured to carry an RF signal and an AC signal, and a secondary line connecting the primary line to the at least one tap connector and configured to carry a split off portion of the RF signal. The directional coupler also includes a tapped line circuit which is inhibited from carrying the AC signal. The mainline transformer includes a ferrite element surrounding the primary line and which is split in at least one location to include a gap of non-magnetic material that inhibits saturation of the ferrite element.

19 Claims, 12 Drawing Sheets

(58) Field of Classification Search
USPC .......................................... 333/109–112, 116
See application file for complete search history.

(56) References Cited

U.S. PATENT DOCUMENTS

| | | |
|---|---|---|
| 6,111,465 A | 8/2000 | Kakuta |
| 2007/0176723 A1 | 8/2007 | Renz |
| 2010/0079218 A1 | 4/2010 | Albag |
| 2011/0090719 A1 | 4/2011 | Benjamin |
| 2017/0201001 A1 | 7/2017 | Boskaljon |

OTHER PUBLICATIONS

International Search Report issued in corresponding International Patent Application No. PCT/US2018/050351 dated Nov. 11, 2018, consisting of 2 pp.

* cited by examiner

POWER PASSING DIRECTIONAL COUPLER HAVING A SPLIT FERRITE ELEMENT

CROSS REFERENCE TO RELATED APPLICATION

This application claims the benefit of U.S. Provisional Application 62/556,695 filed on Sep. 11, 2017, which is incorporated by reference as if fully set forth.

FIELD OF INVENTION

The present invention relates to directional couplers, and, more particularly, to a power passing directional coupler having a split ferrite element with a spatial gap.

BACKGROUND

Directional couplers are devices which are used to divide or tap a portion of a signal based on the direction of the signal flow. FIGS. 1A and 1B illustrate examples of a directional coupler. These three port devices provide an unequal split of signals flowing in the mainline from Port A to Port B while fully passing signals flowing from Port B to Port A. In an ideal directional coupler, Port B and Port C port are fully isolated so any signals flowing in Port B will not appear at Port C. For example, a directional coupler may be used in a passive CATV device to tap radio frequency (RF) signals for delivery to end users with minimal signal loss in the main carrying line.

Directional couplers are often used only for RF signals. When it comes to the application of combining RF and AC, conventional devices require a RF choke to bypass the AC power from the directional coupler. For example, in a multi tap device for CATV systems, schematically shown in FIG. 1C, AC power may be supplied with the RF signals to powered devices along the way, such as line amplifiers, enabling the RF signal to travel long distances with relatively low signal loss. Conventional multi tap devices may use a RF choke to bypass the AC from input port to output port such that only the RF signal goes through the directional coupler to the tap port.

As technology advances in the areas which utilize these RF signals, there is a greater need for the devices and components in the cable network to support greater bandwidth signals. In the past, supplied RF signals in CATV systems have been in the range of 5-1000 MHz. More recently, this range has been increasing and a capability of handing 1.8 GHz signals or greater will likely become industry standard for many devices with a potential need for a bandwidth of 3 GHz or more. Current solutions of using a RF choke have frequency limits which prevent their use with the larger bandwidth.

The present disclosure is directed to overcoming these and other problems associated with prior directional couplers.

SUMMARY

In one aspect, the present disclosure is directed to a directional coupler. The directional coupler includes an input connector, an output connector, and at least one tap connector. The directional coupler also includes a mainline transformer T1 and a tap line transformer T2. The primary line of the mainline transformer connects the input connector to the output connector and configured to carry an RF signal and an AC signal, and a secondary line of the tap line transformer connects to the at least one tap connector and configured to carry a split off portion of the RF signal. The directional coupler also includes a tapped line circuit which inhibits the tapped line from carrying the AC signal. The directional coupler uses a split ferrite toroid or ring in the mainline transformer. The ferrite ring is split in a least one location to include an air gap or a gap filled with a non-magnetic material that cannot saturate. The gap in the ferrite ring is to provide a break in the ferromagnetic material so external magnetizing H fields created by a high AC current signal going through the ferrite ring will reduce the magnetization of the ferrite and therefore, limit the probability of ferrite saturation. As ferrites saturate, the device becomes nonlinear and can create intermodulation distortion which is undesired in a broadband CATV system.

In another aspect, the present disclosure is directed to a directional coupler. The directional coupler includes a circuit board including at least one opening, an input connector, an output connector, and at least one tap connector connected to the circuit board. The directional coupler also includes a mainline transformer and a tap line transformer. The primary line of the mainline transformer connects the input connector to the output connector and configured to carry an RF signal and an AC signal, and a secondary line of the tap line transformer connects the primary line to the at least one tap connector and configured to carry a split off portion of the RF signal. The directional coupler also includes a tapped line circuit which inhibits the tapped line from carrying the AC signal. The directional coupler uses a split ferrite ring in the primary line transformer. The ferrite ring is split in a least one location to include an air gap or a gap filled with a non-magnetic material that cannot saturate. At least a portion of the ferrite ring is received in the opening in the circuit board.

BRIEF DESCRIPTION OF THE DRAWINGS

The foregoing Summary and the following detailed description will be better understood when read in conjunction with the appended drawings, which illustrate a preferred embodiment of the invention. In the drawings.

DETAILED DESCRIPTION OF THE PREFERRED EMBODIMENT(S)

The present disclosure relates to a power passing directional coupler which includes a ferrite element having at least one air gap or a gap filled with a non-magnetic material that cannot saturate. The gap in the ferrite ring is to provide a break in the ferromagnetic material so external magnetizing H fields created by a high AC current signal going through the ferrite ring will reduce the magnetization of the ferrite and therefore, limit the probability of ferrite saturation. As ferrites saturate, the device becomes nonlinear and can create intermodulation distortion which is undesired in a broadband CATV system. The non-magnetic gap may be formed as an air gap, or, in some embodiments, may include a filler, such as paper, plastic, polyester, epoxy, adhesive, etc. Control over the size of the gap, size of ferrite core and ferrite materials help to optimize the RF performance and how readily the ferrite may saturate under high AC current conditions. A disclosed directional coupler can support high frequency RF signals of at least 3 GHz.

The present disclosure also relates to a manner in which the ferrite element is mounted in a directional coupler. In at least some embodiments, the ferrite element is in the form of a ferrite ring having at least one air gap or a gap filled with a non-magnetic material that cannot saturate which is attached to a circuit board that includes an opening for receiving a portion of the ferrite ring. The opening may cradle the ferrite ring and align the opening of the ring with one or more conductive lines of the electronic device. In some embodiments, the circuit board may include two openings which each receive a portion of the ferrite ring such that a portion of the circuit board extends through the ferrite ring. This feature allows one or more of the conductive lines to be printed on the circuit board.

Figure 1A:
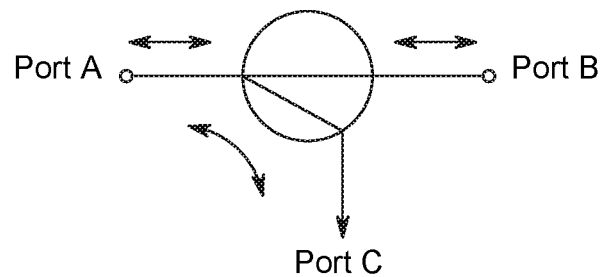
FIG. 1A is a symbolic representation of a directional coupler.
Figure 1B:
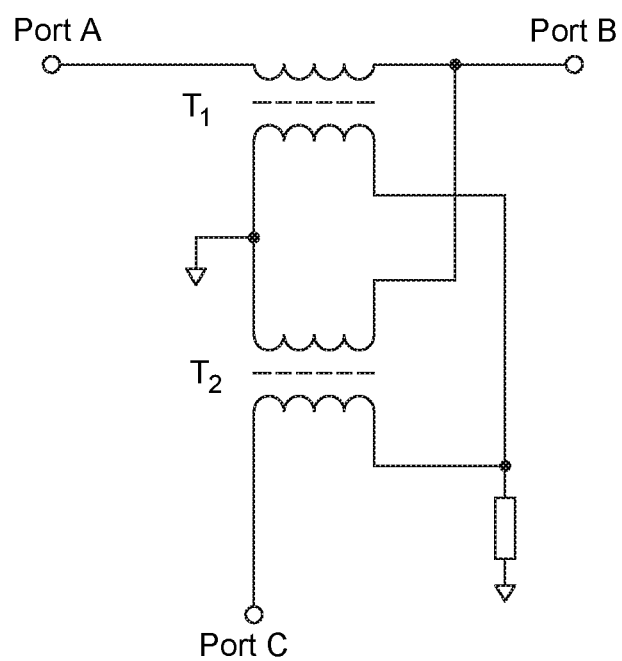
FIG. 1B is a circuit equivalent of a direction coupler.
Figure 1C:
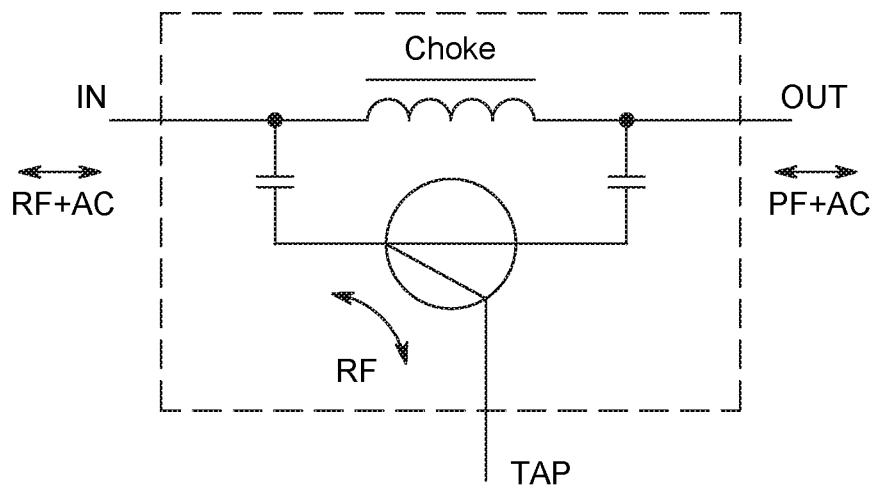
FIG. 1C is a circuit configuration of existing prior art multi tap.
Figure 2A:
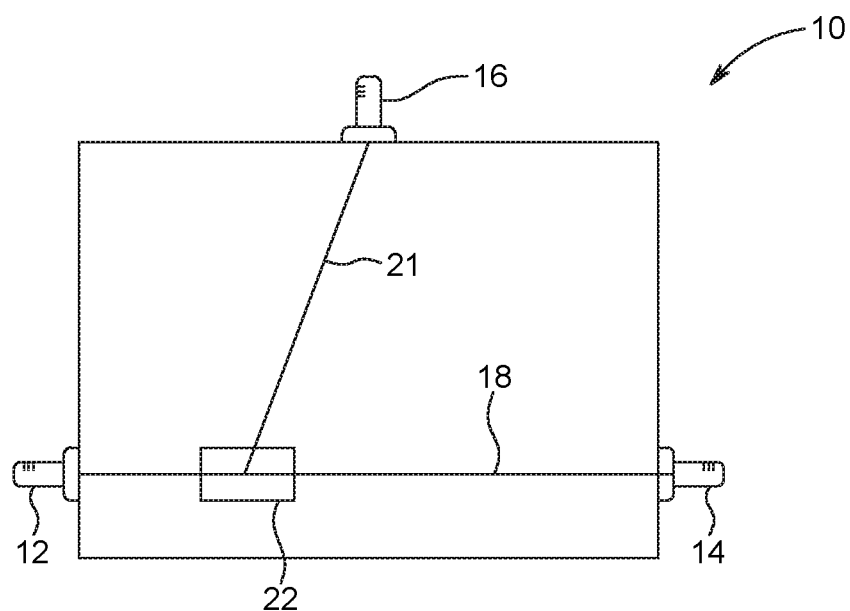
FIG. 2A is a schematic view of an electronic device, according to an exemplary embodiment.

FIG. 2A is an illustration of an electronic device 10, according to an exemplary embodiment. The electronic device 10, which may be a tap, passive coupler, or the like, includes a plurality of connectors which include an input connector 12, an output connector 14, and at least one tap connector 16. FIG. 2A schematically illustrates a primary line 18 which connects the input connector 12 to the output connector 14, a coupler 22 coupled to the tapped line 21 to primary line 18, and the tapped line 21 connected to the tap connector 16. The coupler 22 may be a transformer, for example, although other configurations are possible. The RF signal carried by the primary line 18 is split off by the coupler 22 so that a portion of the RF signal is carried by the tapped line 21. The tapped line 21 delivers the split-off signal to the tap connector 16. The AC power passes from input connector 12 through primary line 18 to the output connector 14.

In one example, the electronic device receives an input signal at the input connector 12. The input signal may include a combined RF and AC signal. This type of combined signal is often used in CATV systems where the AC power is provided to devices along the primary line 18, such as amplifiers which allow the signal to carry across long distances. The RF signal is configured to be delivered to end users for use in one or more devices such as CATV boxes, televisions, modems, computers, etc. The electronic device 10 is a directional coupler which allows the AC power signal to pass through from the input connector 12 to the output connector 14 and the RF signal is split off to the at least one tap connector 16 for delivery to end user devices. While one tap connector 16 is illustrated in FIG. 2A, it should be understood that more than one tap connector may be included by dividing the split off RF signal among multiple connectors.

Figure 2B:
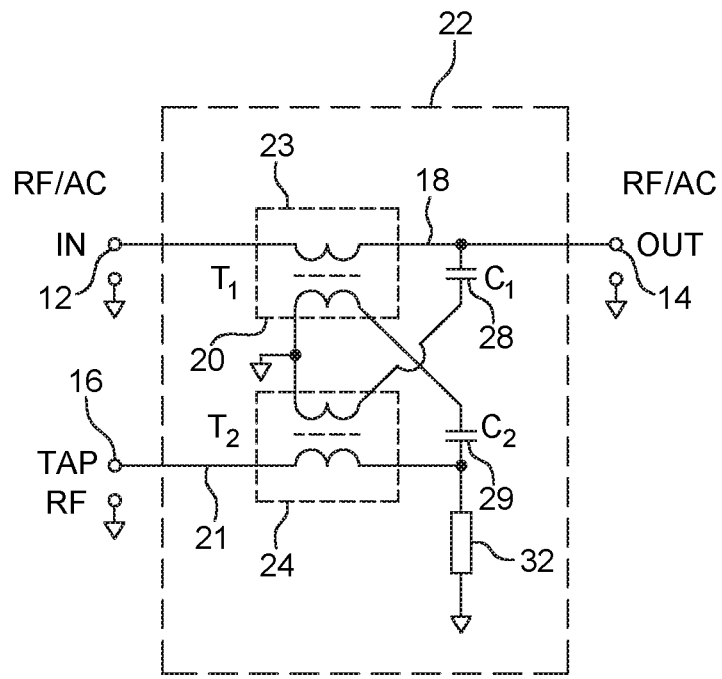
FIG. 2B is a schematic of an electronic circuit which corresponds to the electronic device of FIG. 2A.

FIG. 2B illustrates a schematic of an exemplary circuit 22B which may be implemented in the electronic device 10. The "IN" junction corresponds to the input connector 12, the "OUT" junction corresponds to the output connector 14, and the "TAP" junction corresponds to the tap connector 16. In an exemplary embodiment, the primary line 18 carries an RF signal and AC power from input connector 12 through primary mainline transformer 23 (T1). The RF signal is unequally split with most of the RF signal flowing towards the output connector 14 with the AC and a smaller RF signal flowing through a blocking (high voltage) capacitor 28 (C1) to the tap line transformer 24 (T2) to the tap connector 16. The voltage rating for the capacitor 28 (C1) depends on the AC voltage on the primary line 18. For example, the typical AC voltage is around 90 VAC in CATV applications but the voltage must be high enough to withstand harsh environmental conditions including lightning surges, induced voltages nearly power lines, etc. Accordingly, typical voltage ratings is 1 kV if used for the capacitor 25 (C1). In some instance, capacitor 28 (C1) may be a 1000 pF. However, different capacitors may be used based on the particular configurations of the main line transformer 23 (T1) or the tap line transformer 24 (T2).

A first side of the secondary line 20A of the primary mainline transformer 23 (T1) and a first side of secondary line 20B of the a tap line transformer 24 (T2) are connected to ground. A second side of the secondary line 20B of the tap line transformer 24 (T2) is connected to the output connector 14 via a capacitor 28 (C1). A second side of the side of the secondary line 20A of the primary mainline transformer 23 (T1) is connected to a primary line of the tap line transformer 24 (T2). The second side of the secondary line 20B is further connected to ground via an isolating resistor 32. The resistance of the isolating resistor 32 may be determined by the impedance matching of the tap line transformer 24 or the main line transformer 23. For example, the resistance of the isolating resistor 32 is dependent on the amount of coupling of the directional coupler.

Figure 2C:
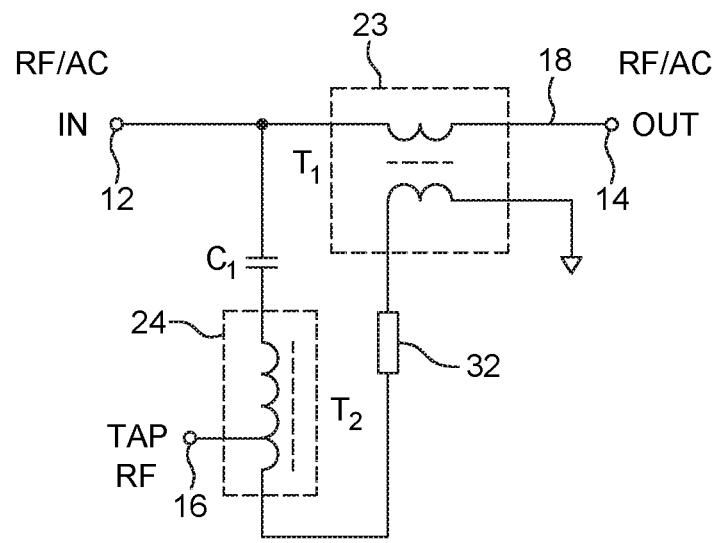
FIG. 2C is another schematic of an electronic circuit which corresponds to the electronic device of FIG. 2A.

FIG. 2C a schematic of another exemplary circuit 22C which may be implemented in the electronic device 10. The "IN" junction corresponds to the input connector 12, the "OUT" junction corresponds to the output connector 14, and the "TAP" junction corresponds to the tap connector 16. The input connector 12 is connected to the tap connector 16 through a blocking (high voltage) capacitor 28 (C1) and a tap line transformer 24 (T2). The tap line transformer 24 (T2) is further connected to ground via an isolating resistor 32 and secondary line 20 of a primary mainline transformer 23 (T1). The input connector 12 is connected to the output connector 14 through a primary line 18 of primary mainline transformer 23 (T1).

Figure 3:
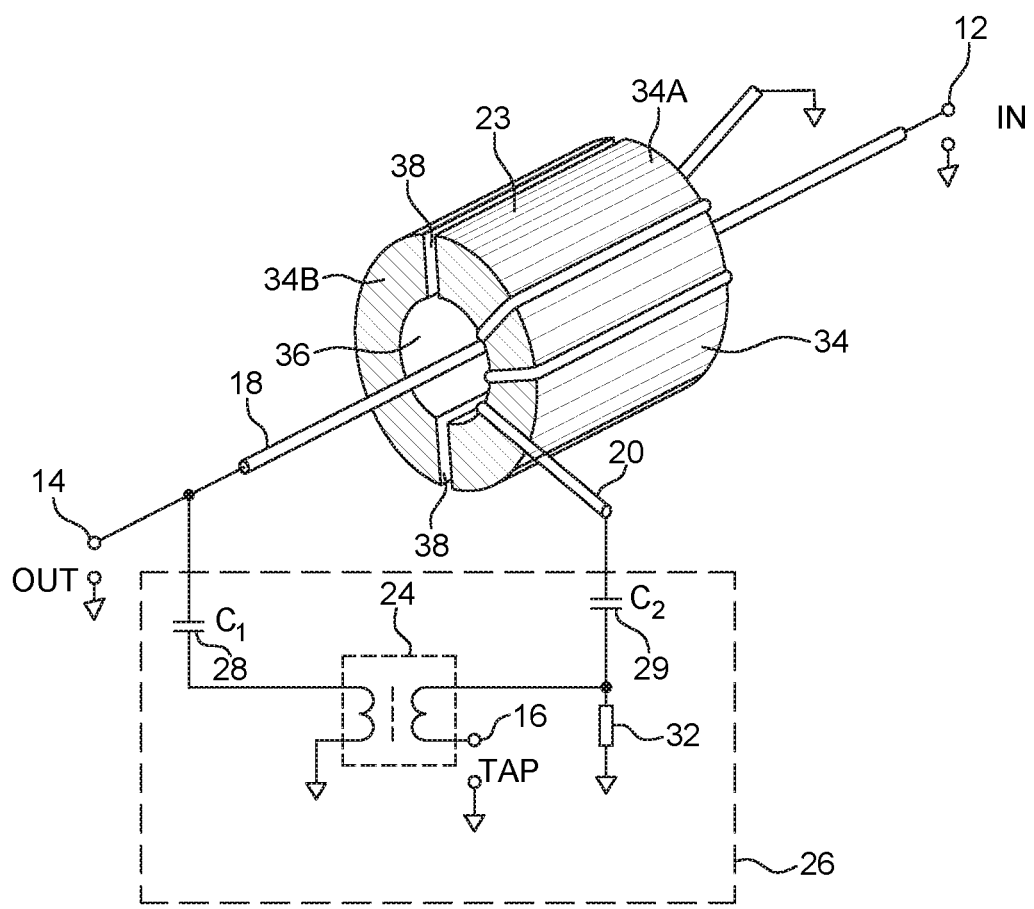
FIG. 3 is another schematic of the electronic circuit of FIG. 2B, including a perspective view illustration of a mainline transformer according to an exemplary embodiment.

FIG. 3 is a further schematic view of the directional coupler 22, including a perspective view of an exemplary mainline transformer 23, consistent with a preferred embodiment. The mainline transformer 23 includes a ferrite element, which can be in the form of a gapped ferrite ring 34. The ferrite ring 34 includes a through hole 36 which passes transversely through the ferrite ring 34. While the ferrite ring 34 is depicted as cylindrical and described as a ring, it should be understood that it is not limited to these configurations. For example, the ferrite ring 34 may be square, rectangular, or another shape.

The primary line 18 passes through the through hole 36 as it travels from the input connector 12 to the output connector 14, typically carrying the broadband RF signal and AC power. In an exemplary embodiment, the secondary line 20 of mainline transformer 23 is wound around the gapped ferrite ring 34. One end of the secondary line 20 is preferably connected to ground and an opposite end of the secondary line 20 is preferably connected to the tap line transformer 24 through blocking capacitor 29 (C2) and isolation resistor 32. The blocking capacitor 28 (C1) blocks AC power and only allow the broadband RF signal passing through from primary line 18 to the tap line transformer 24 (T2) and further to the tap connector 16. In some instance, the blocking capacitor 28 (C2) may be a 1000 pF. However, different capacitors may be used based on the particular configurations of the main line transformer 23 (T1) or the tap line transformer 24 (T2).

As shown in FIG. 3, the ferrite ring 34 includes at least one gap 38. The gap 38 can be an air gap or filled with another non-magnetic material, such as paper, plastic, polyester, epoxy, adhesive, or other filler material. The non-magnetic gap 38 increases the saturation limit (i.e., decreasing the saturation for a given magnetic flux) of mainline transformer 23, thereby inhibiting saturation of the ferrite element. If the ferrite ring 34 is saturated (i.e., due to the magnetic flux associated with the inductance of the high frequency signal), the coupler 22 may be unable to adequately tap the RF signal from the tap connector 16. The inclusion of the gap 38 helps to optimize the inductance and saturation. As ferrites saturate, the carried signals become nonlinear and can create intermodulation distortion which is undesired in a broadband CATV system.

The gap 38 preferably extends across an entire length of the ferrite ring 34. In other words, the gap 38 provides a complete break in the circumferential direction of the ferrite ring 34. The presence of the gap 38 inhibits the inductance of the AC signal from the primary line 18 to the secondary line 20. The tapped line circuit 26 includes the additional capacitor 29 (C2) in order to block any AC signal.

In the embodiment of FIG. 3, the ferrite ring 34 is divided into two separate pieces 34A and 34B. This creates two gaps 38, which can be found at the locations where the separate pieces 34A and 34B come together to form the ferrite ring 34. In other embodiments, the gaps 38 may be increased by dividing the ferrite ring 34 into additional pieces. The gaps 38 may be positioned in any location with respect to the primary line 18 and secondary line 20 and the rest of the circuit 26.

Figure 4A:
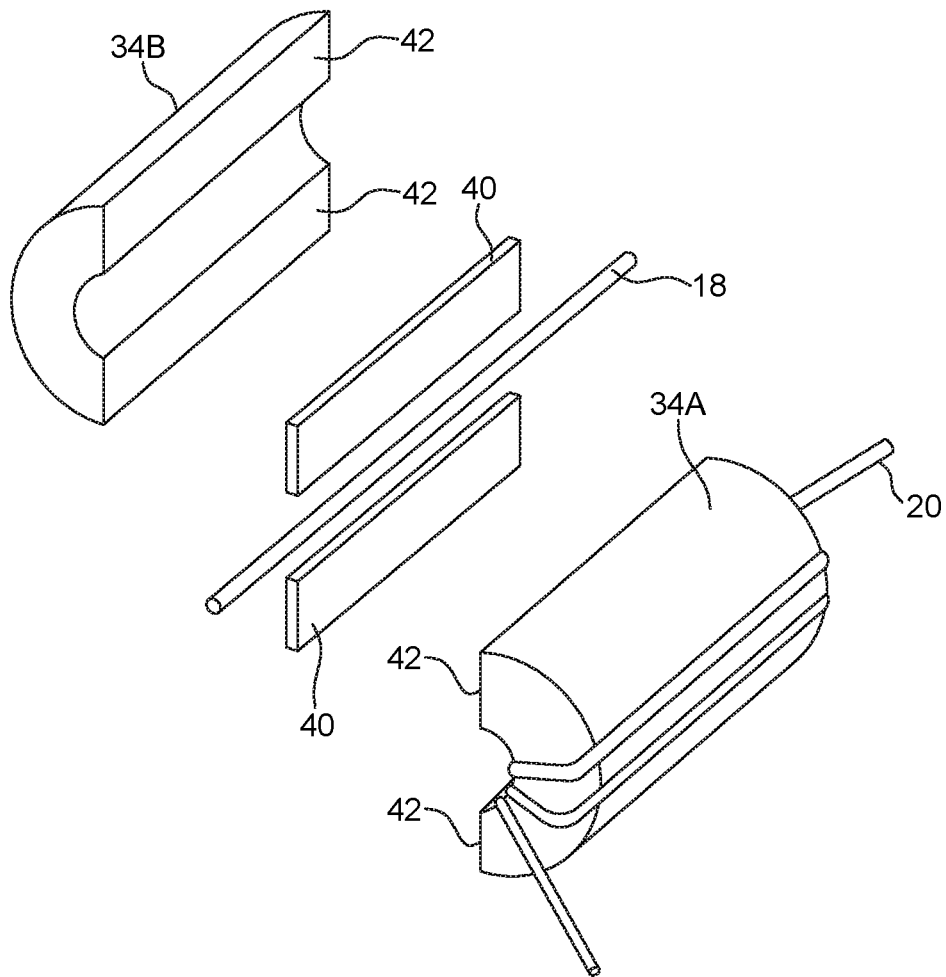
FIG. 4A is an exploded view of the mainline transformer of FIG. 3, according to a first embodiment.
Figure 4B:
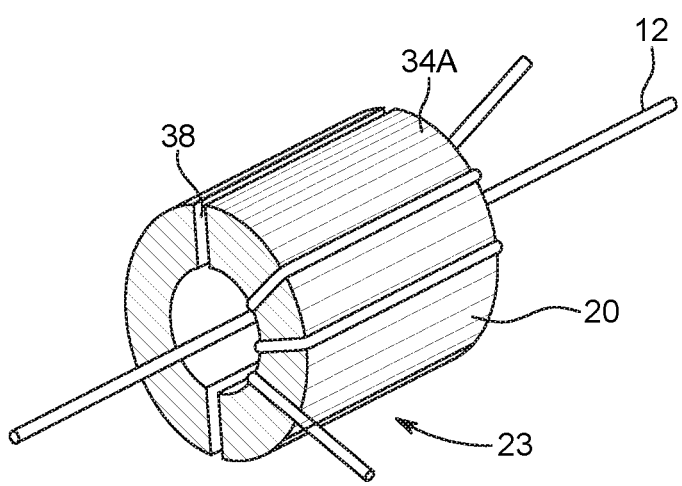
FIG. 4B is a perspective view of a mainline transformer according to a second embodiment.

FIG. 4A is an exploded view of the mainline transformer 23. The transformer includes the two pieces 34A, 34B of the ferrite ring 34. In this embodiment, the pieces 34A, 34B are formed as halves of the ferrite ring 34, but it should be understood that other configurations of one or multiple pieces are possible. For example, FIG. 4B illustrates another embodiment of the ferrite ring 34 which includes only one non-magnetic gap 38.

As shown in FIG. 4A, the primary line 18 is arranged to pass through the two pieces 34A, 34B when they come together and the secondary line 20 is wound around piece 34A. The number of turns of the secondary line 20 may be selected based on the desired turns ratio according to given directional coupling requirements. In some embodiments, the secondary line 20 may be wound around one or both of the pieces 34A, 34B of the ferrite ring 34.

As shown in FIG. 4A, the mainline transformer 23 may include a filler material 40 positioned at the location where the gap 38 is located in the ferrite ring 34. In an exemplary embodiment, the filler material 40 is a non-magnetic material, such as paper, plastic, polyester, epoxy, adhesive, or other filler material. The filler material 40 preferably substantially matches the shape of a sidewall 42 of the piece 34A, 34B which is exposed at the location of the gap 38. The filler material 40 is preferably attached to the opposing sidewalls 42 of the pieces 34A, 34B.

The filler material 40 helps to control the size of the gap(s) 38. For example, by contacting/being attached the sidewalls 42, the gaps 38 may be controlled to be equal to the thickness of the filler material 40. Further the filler material 40 inhibits the gap 38 from changing in size due to deformation, shifting, or the like. The size of the gap 38 is preferably selected to optimize the inductive properties for optimal RF performance while providing a break in the ferromagnetic material so external magnetizing H fields created by a high AC current signal going through the ferrite ring will reduce the magnetization of the ferrite and therefore, limit the probability of ferrite saturation. Thus, the filler material 40 helps to achieve and maintain those properties.

In some embodiments, the filler material 40 in at least one of the gaps 38 may be replaced by an air gap. This includes the ferrite ring 34 being formed with air gaps. In one embodiment, the ferrite ring 34 may be in a "C" configuration with one air gap as shown in FIG. 4B. In other embodiments, the ferrite ring 34 may include at least three pieces and at least three gaps.

Figure 4C:
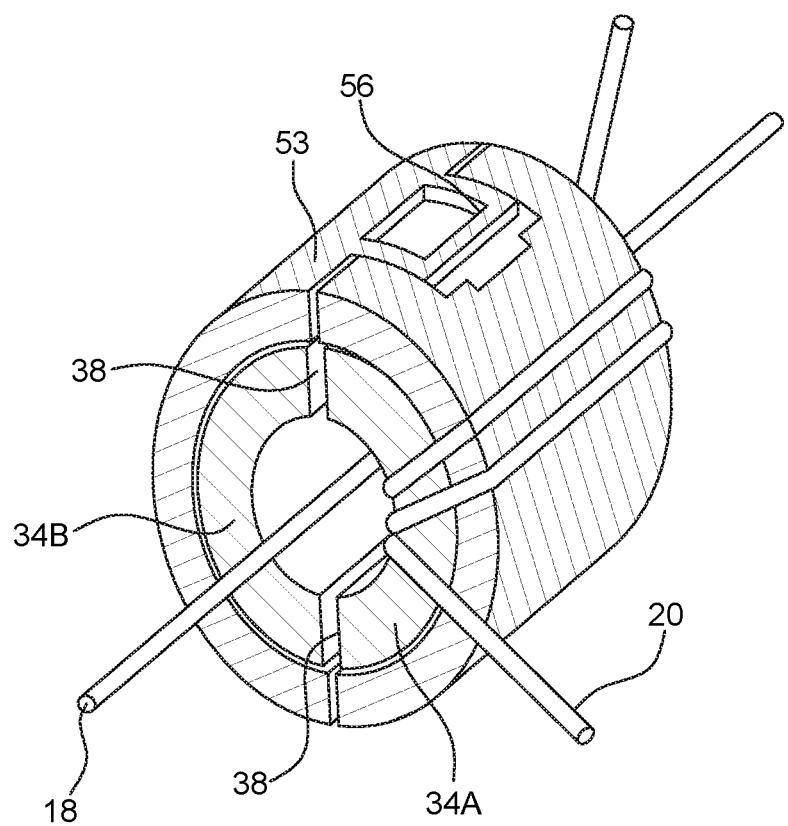
FIG. 4C is a perspective view of a mainline transformer according to a third embodiment.

The pieces of the ferrite ring 34 may be connected to each other in a variety of manners. In one embodiment, the filler material 40 may be an adhesive which connects the pieces of the ferrite ring 34. In other embodiments, the gapped ferrite ring 34 can have their associated pieces held in place in a plastic shell 53 to maintain the gap as shown in FIG. 4C. The plastic shell 53 may include corresponding connectors 56 which attach to each other to allow for ease of insertion of the ferrite ring 34.

Figure 4D:
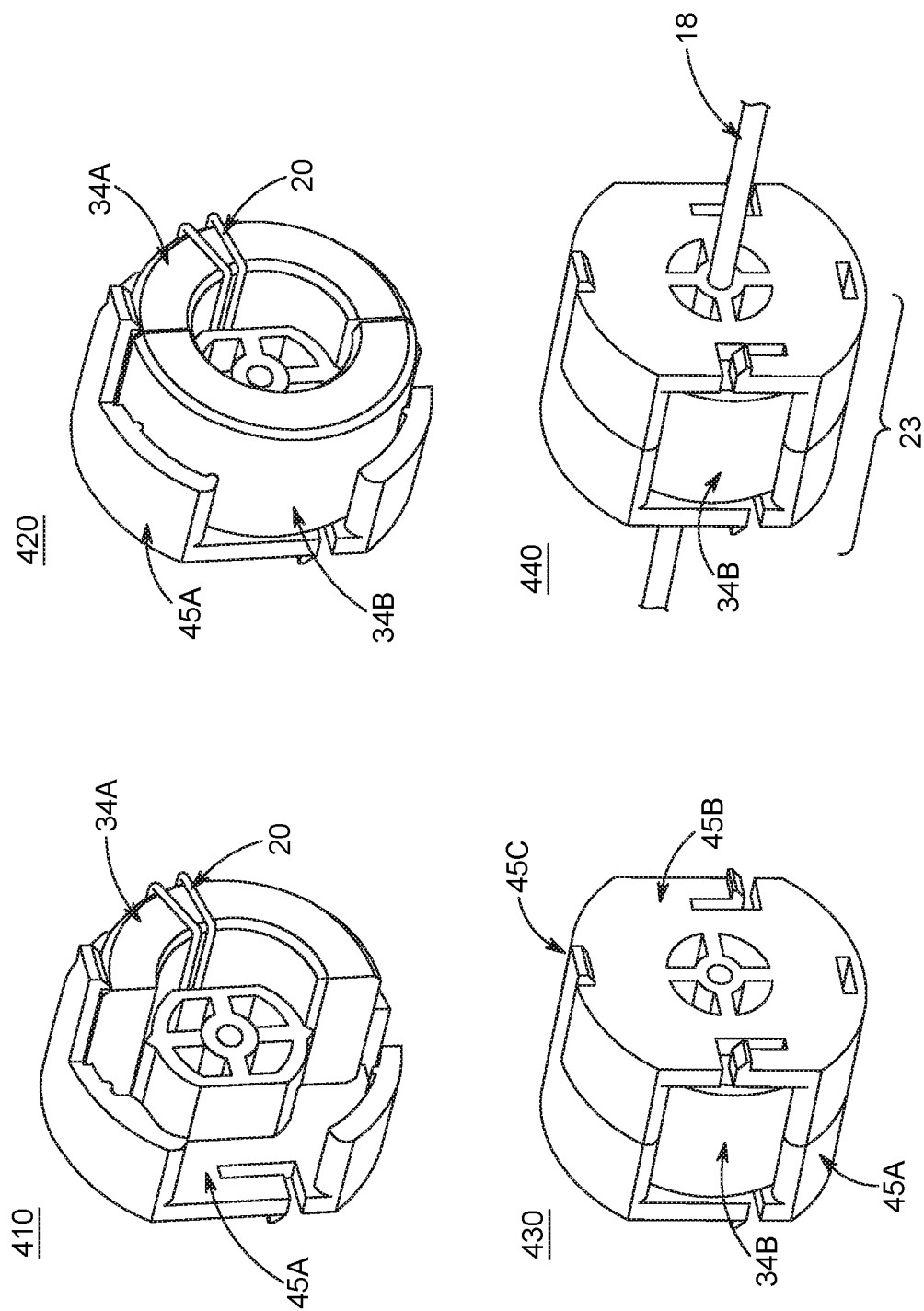
FIG. 4D is a perspective view of a mainline transformer according to a fourth embodiment.

FIG. 4D illustrates the assembly a fourth embodiment of the mainline transformer 23 that begins with partial assembly 410 and finishes with partial assembly 440. In partial assembly 410, the first piece 34A of the ferrite ring 34 is inserted into a first housing 45A. In partial assembly 420, the second piece 34B of the ferrite ring 34 is inserted into the first housing 45A. Then in partial assembly 430, a second housing 45B is connected to the first housing 45A. In some instances the first housing 45A and 45B are held together using clips 45C. In some instances the first housing 45A and the second housing 45B may be formed from an isolating material such as a plastic. Partial assembly 440 shows the transformer 23 after the primary line 18 is inserted.

Figure 5A:
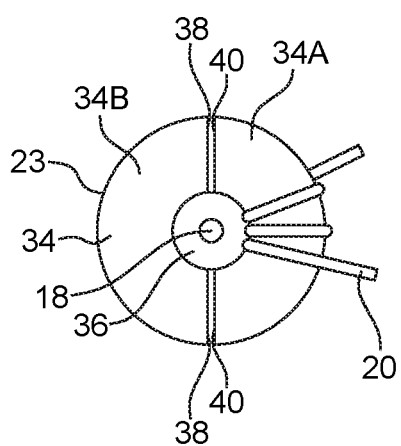
FIG. 5A is a axial side view of the mainline transformer of FIG. 4A.
Figure 5B:
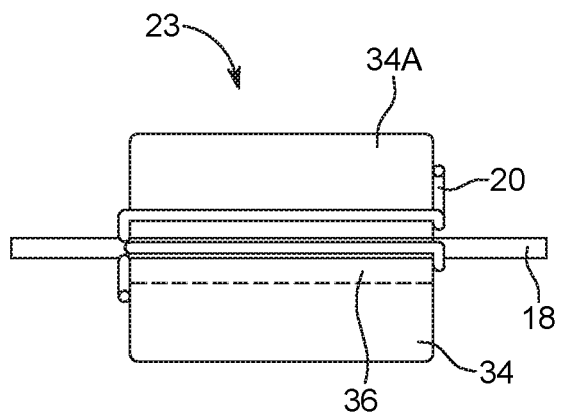
FIG. 5B is a transverse side view of the mainline transformer of FIG. 4A.
Figure 5C:
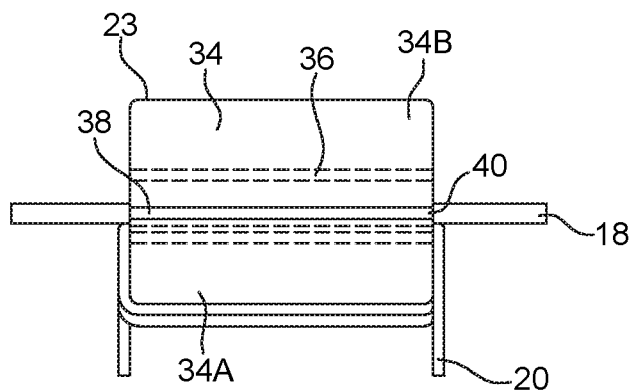
FIG. 5C is a top view of the mainline transformer of FIG. 4A.

FIGS. 5A-5C further illustrate the mainline transformer 23. FIG. 5A includes an axial side view. As shown, the gaps 38 (and filler material 40, if included) may be aligned with each other along a diameter of the ferrite ring 34. In other embodiments, the gaps 38 may be increased (or decreased) in number and/or may be evenly or unevenly distributed around the circumference of the ferrite ring 34.

Figure 6A:
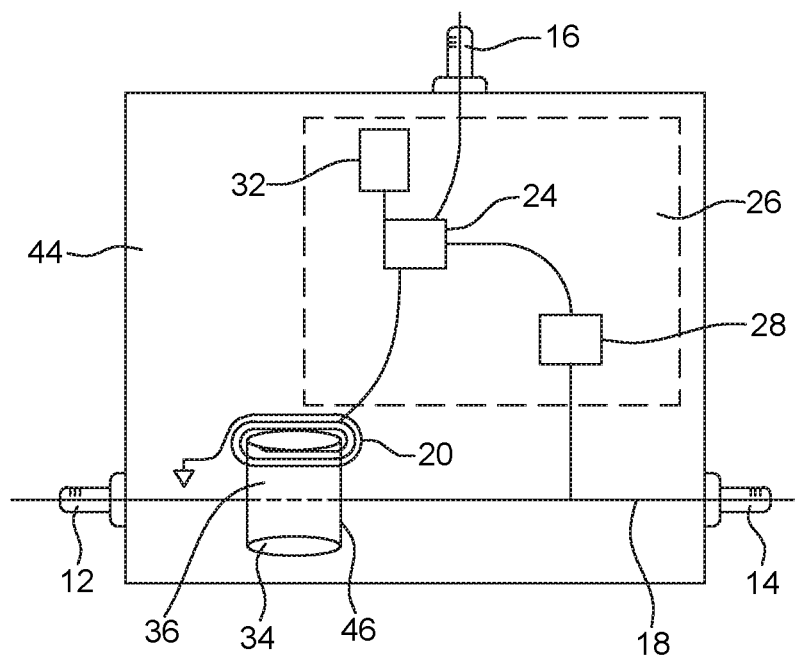
FIG. 6A is a top view schematic illustration of a first embodiment of a circuit board implementing a disclosed transformer.
Figure 6B:
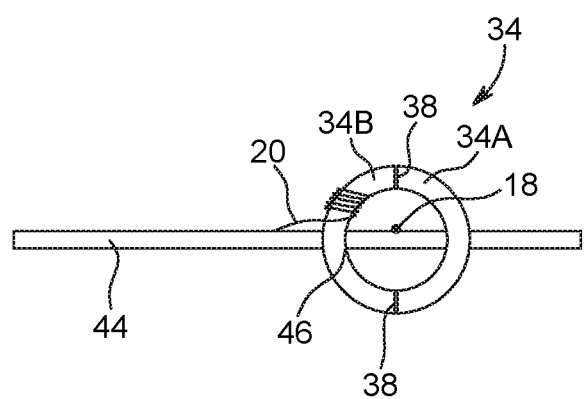
FIG. 6B is a side view of the circuit board of FIG. 6A.

FIGS. 6A-6B illustrate an exemplary implementation of the tap line circuit 26 according to a first embodiment. The circuit 26 is implemented on a circuit board 44. The mainline transformer 23 is configured as the ferrite ring 34 and includes the first piece 34A and the second piece 34B. The primary line 18 extends through a center of the through hole 36 in the ferrite ring 34 from the input connector 12 to the output connector 14.

The circuit board 44 includes an opening 46 formed in the area of the mainline transformer 23. The opening 46 receives a portion of the ferrite ring 34, which allows the primary line 18 to be aligned with the surface of the circuit board 44. The opening 46 cradles the ferrite ring 34 and helps to align the secondary line 20 with the tapped line circuit 26. Edges of the opening 46 may be configured to contact and/or adhere to specific locations on the ferrite ring 34 such that the pieces 34A, 34B are correctly positioned and/or the gaps 38 assume and maintain a selected distance.

Figure 7:
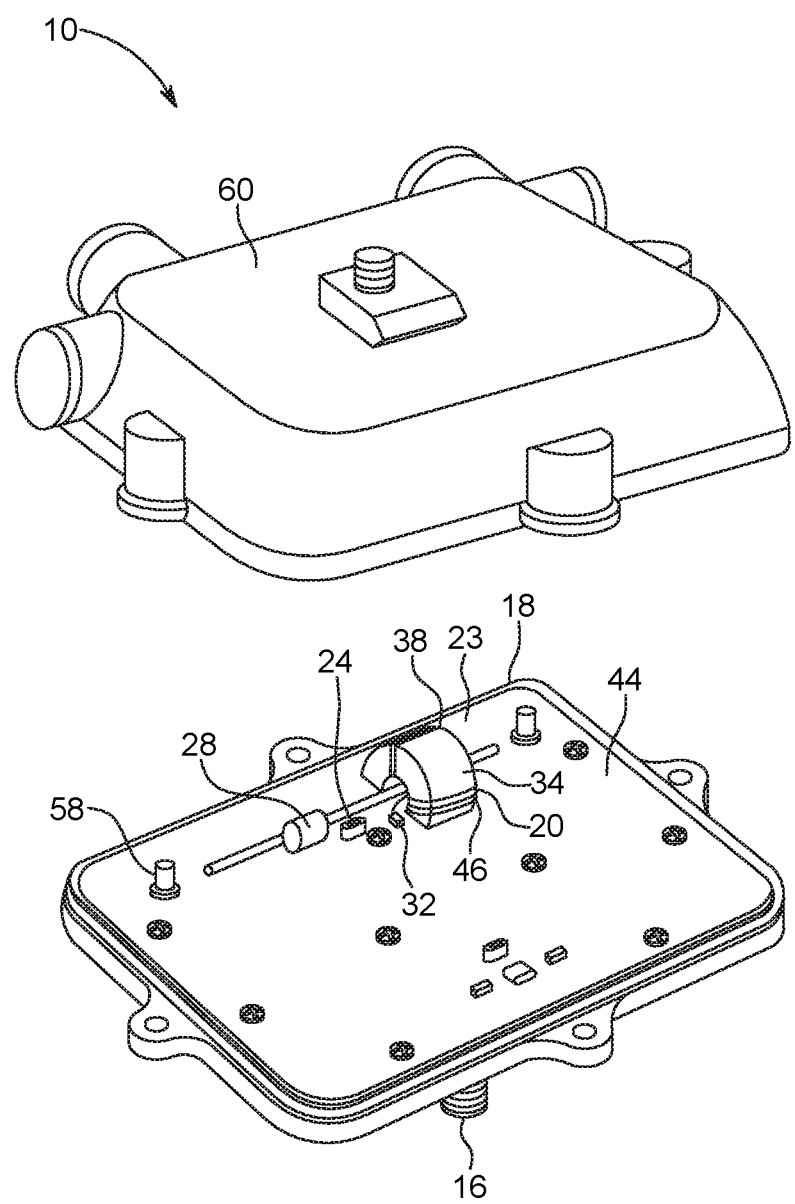
FIG. 7 is a perspective view of a multi tap which includes a directional coupler including a plate element and an outer shell housing.

FIG. 7 illustrates a further implementation of the disclosed embodiments in a directional coupler 10 including the elements of the circuit board 44 being integrated with a tap plate 58 which is inserted into a receiver 60. This allows the tap plate 58 to be interchangeable with a variety of receivers and provides for ease of replacement in the case of damage or when a system is upgraded. The tap plate 58 is positioned and connected to the receiver 60 in a manner known in the art. The receiver 60 protects the circuitry elements on the tap plate 58, including the ferrite ring 34.

Figure 8A:
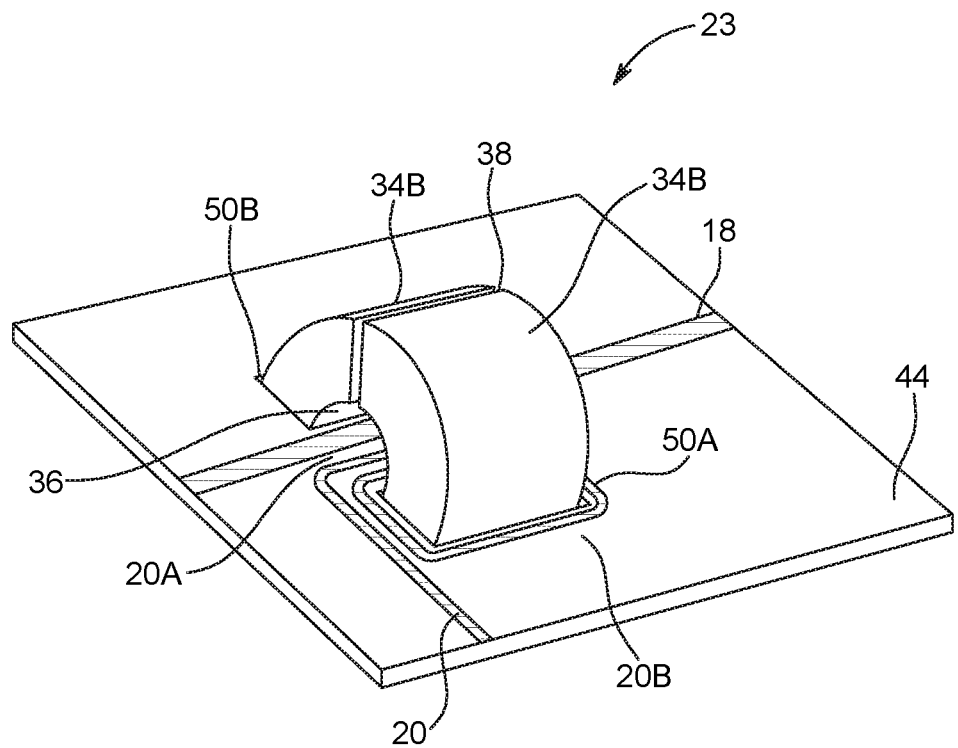
FIG. 8A is a perspective view illustration of an alternative embodiment of a circuit board implementing a disclosed transformer.
Figure 8B:
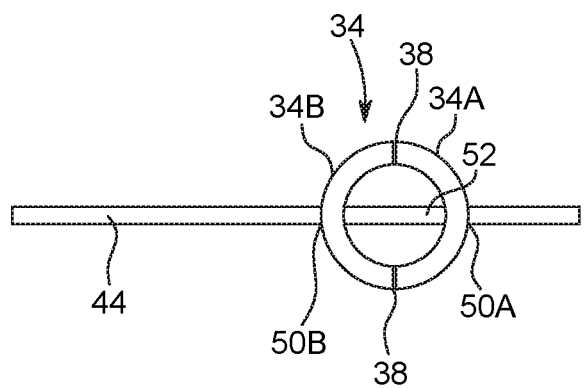
FIG. 8B is a side view of the circuit board of FIG. 8A.

FIGS. 8A-8B illustrate another exemplary implementation of the mainline transformer 23, according to an alternative embodiment. In this embodiment, at least one of the primary line 18 and the secondary line 20, or selected portions thereof, are printed on a circuit board 44. For example, the primary line 18 may be printed to connect the input connector 12 to the output connector 14. The printed primary line 18 passes through the ferrite ring 34 through hole 36. In order to achieve this, the circuit board 44 preferably includes a pair of openings 50A, 50B, each receiving a portion of the ferrite ring 34. A bridge 52, which is a portion of the circuit board 44, passes through the through hole 36 in the ferrite ring 34. The primary line 18 is printed on the bridge 52.

In some embodiments, the secondary line 20 is additionally or alternatively printed on the circuit board 44. The printed secondary line 20 may be printed to wind around the outside of the ferrite ring 34, much like wire of the secondary line 20 described in the embodiment of FIG. 6A. The printed secondary line 20 includes a first portion 20A which travels across the bridge 52 inside of the through hole 36 of the ferrite ring 34 and a second portion 20B which traverses across on outer portion of the ferrite ring 34 on the circuit board 44. A first end of the printed secondary line 20 is connected to ground while a second end of the printed secondary line 20 is connected to the tapped line circuit 26 (leading to the tap connector 16).

It should be understood that the above embodiments are only examples and the disclosure is not limited to them. Selected features of these embodiments may be combined with each other and/or with other features to produce embodiments which are within the scope of this disclosure. For instance the openings 50A, 50B may be combined with an embodiment which uses wire lines (i.e., non-printed lines). The openings 50A, 50B allow the ferrite ring 34 to encircle a portion of a circuit board, thereby aligning the ferrite ring 34 for use with the primary line 18 and the secondary line 20. Additional modifications are also possible.

Figure 9A:
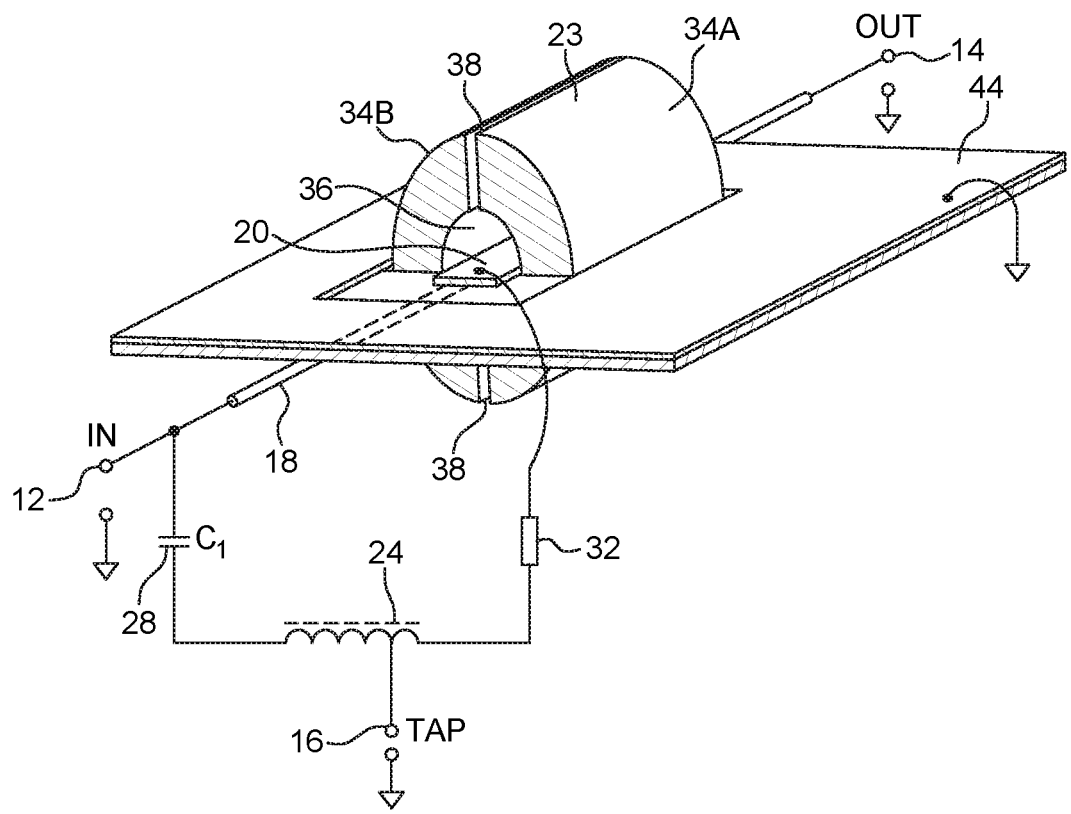
FIG. 9A is another schematic of the electronic circuit of FIG. 2C, including a perspective view illustration of the mainline transformer according to an exemplary embodiment with PCB printed secondary line.

FIG. 9A shows the perspective view of the circuit in FIG. 2c where the primary line 18 of the mainline transformer 23 is a conductor wire on one side of the circuit board and the secondary line 20 of the mainline transformer 23 is printed on the other side of the circuit board. Although the primary line 18 of the mainline transformer 23 is depicted as a wire, in some embodiments the primary line may be a printed line on the printed circuit board 44.

Figure 9B:
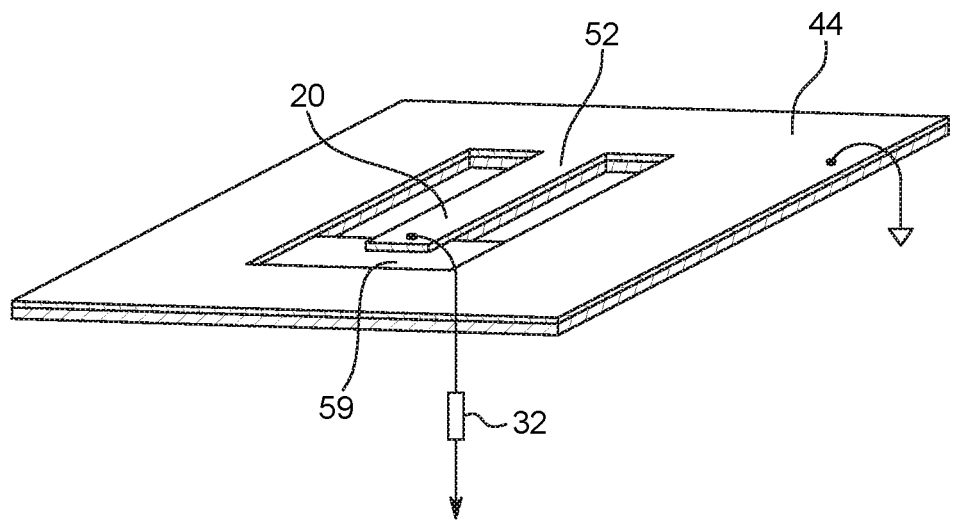
FIG. 9B shows the secondary line of mainline transformer is printed on a circuit board.

FIG. 9B shows the circuit board 44 without the split ferrite where the secondary line 20 is a printed trace on the circuit board. The printed secondary line 20 is connected to ground on one side and has a gap 59 on the bridge 52 on the other side so the printed trace here is not connected to the ground and can be connected to isolating resistor 32, tap line transformer 24, blocking (high voltage) capacitor 28 (C1) and connected to primary line 18 as illustrated in FIG. 2C and FIG. 9A.

In some aspects, the present disclosure is directed to an improved broadband directional coupler. The disclosed coupler is particularly applicable to use in directional couplers, especially those which tap an RF signal from a primary line carrying RF and AC. The mainline transformer includes one or more gaps which prevent the mainline transformer from becoming saturated. The disclosed configurations of a device implement the directional coupler in a beneficial environment in which features help to maintain the advantages of the coupler. For example, winding a tapped line around a portion of the ferrite ring and/or extending a portion of a circuit board through the ferrite ring help to position the one or more pieces of the ring. This positioning helps to maintain the disclosed gap(s), thereby solidifying its advantages.

The disclosed directional coupler is configured to enable power-passing of AC current and broadband RF while effectively tapping a portion of an accompanying RF signal. The disclosed embodiments provide this capability for signals up to at least 3 GHz. The disclosed ferrite elements including at least one gap that inhibits saturation of the ferrite element provides the effect of preventing a significant amount of AC signal from reaching the secondary line or secondary circuitry. A pair of capacitors respectively help to ensure that current is blocked from traveling from the primary line at the back end and that any current that reaches the tapped line circuit is removed. Therefore, the disclosed embodiments allow for effective RF signal tapping in a compact space.

Having thus described the presently preferred embodiments in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiments and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A directional coupler, comprising:
   an input connector, an output connector, and at least one tap connector;
   a primary line connecting the input connector to the output connector and configured to carry an RF signal and an AC signal and including a mainline transformer;
   a secondary line connecting the primary line to the at least one tap connector and configured to carry a split off portion of the RF signal; and
   a tapped line circuit which is inhibited from carrying the AC signal;
   wherein the mainline transformer includes a ferrite element surrounding the primary line, wherein the ferrite element is split in at least one location to include a gap of non-magnetic material to thereby inhibit saturation of the ferrite element, and the secondary line is wound around the ferrite element.

2. The directional coupler of claim 1, wherein the tapped line circuit includes at least one capacitor and a second transformer.

3. The directional coupler of claim 1, wherein one end of the secondary line is connected to ground and an opposite end is connected to the tapped line circuit.

4. The directional coupler of claim 1, wherein the non-magnetic material is air.

5. The directional coupler of claim 1, wherein the non-magnetic material is a solid filler that is formed from one or more of paper, plastic, polyester, epoxy, and adhesive.

6. The directional coupler of claim 5, wherein the solid filler contacts opposing sidewalls of the ferrite element in the gap.

7. The directional coupler of claim 1, wherein the gap extends across an entire length of the ferrite element to form a complete break in the circumferential direction.

8. A directional coupler, comprising:
   an input connector, an output connector, and at least one tap connector;
   a primary line connecting the input connector to the output connector and configured to carry an RF signal and an AC signal and including a mainline transformer;
   a secondary line connecting the primary line to the at least one tap connector and configured to carry a split off portion of the RF signal; and
   a tapped line circuit which is inhibited from carrying the AC signal;
   wherein the mainline transformer includes a ferrite element surrounding the primary line, wherein the ferrite element is split in at least one location to include a gap of non-magnetic material to thereby inhibit saturation of the ferrite element, and
   the ferrite element is split in at least two locations such that the ferrite element is formed of multiple separate pieces and the at least one gap includes a plurality of gaps.

9. The directional coupler of claim 8, wherein the multiple separate pieces are two equal halves of the ferrite element such that the ferrite element includes two gaps which are aligned with each other at a diameter of the ferrite element.

10. The directional coupler of claim 8, wherein the ferrite element is split into at least three pieces such that at least three gaps are formed.

11. The directional coupler of claim 8, wherein the plurality of gaps are equally spaced around the circumference of the ferrite element.

12. The directional coupler of claim 8, wherein the plurality of gaps are unequally spaced around the circumference of the ferrite element.

13. The directional coupler of claim 8, wherein at least one of the primary line, the secondary line and the tapped line is printed on a circuit board that holds the directional coupler.

14. An electronic device, comprising:
   a circuit board including at least one opening;
   an input connector, an output connector, and at least one tap connector connected to the circuit board;
   a primary line connecting the input connector to the output connector and configured to carry an RF signal and an AC signal;
   a secondary line connecting the primary line to the at least one tap connector and configured to carry a split off portion of the RF signal;
   a tapped line circuit which inhibits the tapped line from carrying the AC signal;
   a ferrite ring surrounding the primary line to increase the inductance of the RF signal form the primary line to the tapped line,
   wherein the ferrite ring is split in at least one location to include a gap of non-magnetic material, and
   wherein the ferrite ring is positioned in the opening in the circuit board.

15. The electronic device of claim 14, wherein at least one of the primary line, the secondary line and the tapped line is printed on the circuit board.

16. The electronic device of claim 15, wherein the at least one opening includes two openings and the circuit board includes a bridge which extends through the ferrite ring.

17. The electronic device of claim 16, wherein a portion of the primary line is printed on the bridge.

18. The electronic device of claim 17, wherein a first portion of the tapped line is printed on the bridge and a second portion of the tapped line is printed to extend around an outside of the ferrite ring.

19. The directional coupler of claim 14, wherein the gap extends across an entire length of the ferrite ring to form a complete break in the circumferential direction.

* * * * *

(12) EX PARTE REEXAMINATION CERTIFICATE (12315th)
United States Patent
Wu et al.

(10) Number: US 11,152,679 C1
(45) Certificate Issued: Jun. 9, 2023

(54) POWER PASSING DIRECTIONAL COUPLER HAVING A SPLIT FERRITE ELEMENT

(71) Applicant: ANTRONIX INC., Cranbury, NJ (US)

(72) Inventors: Jinquan Wu, New Brunswick, NJ (US); Neil Tang, Princeton, NJ (US)

(73) Assignee: ANTRONIX, INC., Cranbury, NJ (US)

Reexamination Request:
No. 90/014,969, Mar. 2, 2022

Reexamination Certificate for:
Patent No.: 11,152,679
Issued: Oct. 19, 2021
Appl. No.: 16/646,083
PCT Filed: Sep. 11, 2018
PCT No.: PCT/US2018/050351
§ 371 (c)(1),
(2) Date: Mar. 10, 2020
PCT Pub. No.: WO2019/051448
PCT Pub. Date: Mar. 14, 2019

(51) Int. Cl.
*H01P 5/18* (2006.01)
*H03H 7/48* (2006.01)
*H04B 3/56* (2006.01)
*H01P 1/23* (2006.01)

(52) U.S. Cl.
CPC .................. *H01P 5/18* (2013.01); *H01P 1/23* (2013.01); *H03H 7/48* (2013.01); *H04B 3/56* (2013.01)

(58) Field of Classification Search
None
See application file for complete search history.

(56) References Cited

To view the complete listing of prior art documents cited during the proceeding for Reexamination Control Number 90/014,969, please refer to the USPTO's Patent Electronic System.

*Primary Examiner* — Stephen J. Ralis

(57) ABSTRACT

A directional coupler includes an input connector, an output connector, and at least one tap connector. The directional coupler also includes a primary line connecting the input connector to the output connector and configured to carry an RF signal and an AC signal, and a secondary line connecting the primary line to the at least one tap connector and configured to carry a split off portion of the RF signal. The directional coupler also includes a tapped line circuit which is inhibited from carrying the AC signal. The mainline transformer includes a ferrite element surrounding the primary line and which is split in at least one location to include a gap of non-magnetic material that inhibits saturation of the ferrite element.

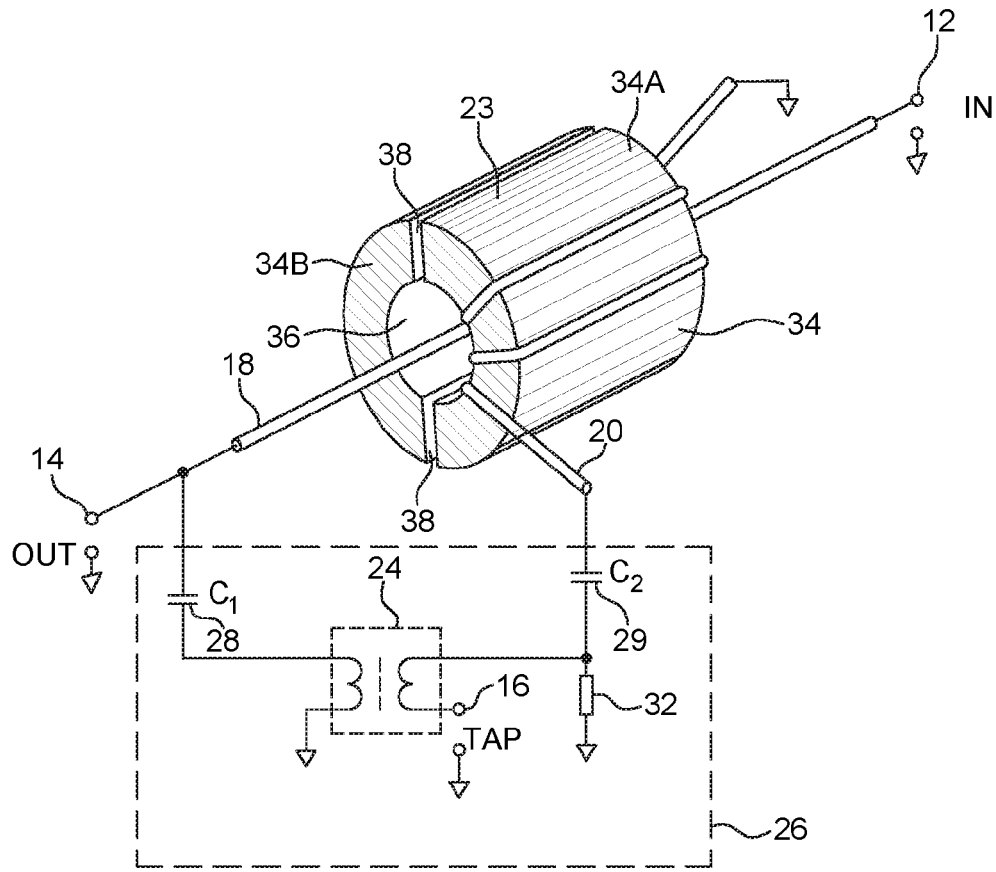

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1-7 is confirmed.

Claim 8 is cancelled.

Claims 9, 11, 13-15 and 18-19 are determined to be patentable as amended.

Claims 16 and 17, dependent on an amended claim, are determined to be patentable.

New claims 20-22 are added and determined to be patentable.

Claims 10 and 12 were not reexamined.

9. The directional coupler of claim [8] *22*, wherein the multiple separate pieces are two equal halves of the ferrite element such that the ferrite element includes two gaps which are aligned with each other at a diameter of the ferrite element.

11. The directional coupler of claim [8] *22*, wherein the plurality of gaps are equally spaced around the circumference of the ferrite element.

13. The directional coupler of claim [8] *22*, wherein at least one of the primary line[.] *and* the secondary line [and the tapped line] is printed on a circuit board that holds the directional coupler.

14. An electronic device, comprising:
a circuit board including at least one opening;
an input connector, an output connector, and at least one tap connector connected to the circuit board;
a primary line *printed on the circuit board that traverses the opening, the primary line* connecting the input connector to the output connector and configured to carry an RF signal and an AC signal;
a secondary line *traversing the opening and* connecting the primary line to the at least one tap connector and configured to carry a split off portion of the RF signal;
a tapped line circuit which inhibits [the tapped line from] carrying the AC signal *to the at least one tap connector*;
a ferrite ring surrounding the primary line *and the secondary line* to increase the inductance of the RF signal [form] *from* the primary line to the [tapped] *secondary* line,
wherein the ferrite ring is split in at least one location to include a gap of non-magnetic material, [and]
wherein the ferrite ring is positioned in the opening in the circuit board, *and*
*wherein the secondary line passes through the ferrite element and is wound around the ferrite element.*

15. The electronic device of claim 14, [at least one of the primary line,] the secondary line [and the tapped line] is printed on the circuit board.

18. The electronic device of claim 17, wherein a first portion of the [tapped] *secondary* line is printed on the bridge and a second portion of the [tapped] *secondary* line is printed to extend around an outside of the ferrite ring.

19. The [directional coupler] *electronic device* of claim 14, wherein the gap extends across an entire length of the ferrite ring to form a complete break in the circumferential direction.

*20. The directional coupler of claim 1, wherein the tapped line circuit inhibits carrying the AC signal to the at least one tap connector.*

*21. A directional coupler, comprising:*
*an input connector, an output connector, and at least one tap connector;*
*a primary line connecting the input connector to the output connector and configured to carry an RF signal and an AC signal and including a mainline transformer;*
*a secondary line connecting the primary line to the at least one tap connector and configured to carry a split off portion of the RF signal; and*
*a tapped line circuit which is inhibited from carrying the AC signal, wherein the tapped line circuit inhibits the secondary line from carrying the AC signal to the at least one tap connector;*
*wherein the mainline transformer includes a ferrite element surrounding the primary line and the secondary line is wound around the ferrite element, wherein the ferrite element is split in at least two locations to include a plurality of gaps of non-magnetic material to thereby inhibit saturation of the ferrite element, and the ferrite element is split such that the ferrite element is formed of multiple separate pieces.*

*22. The directional coupler of claim 21, wherein the plurality of gaps are unequally spaced around the circumference of the ferrite element.*

* * * * *